United States Patent [19]

Boiron et al.

[11] Patent Number: 5,465,069
[45] Date of Patent: Nov. 7, 1995

[54] INTERFACE CIRCUIT AND VOLTAGE-RAISING CIRCUIT INCLUDING SUCH A CIRCUIT

[75] Inventors: Marc Boiron, Bieville-Beuville; Stéphane Bouvier, Langrune/Mer, both of France

[73] Assignee: U.S. Philips Corporation, New York, N.Y.

[21] Appl. No.: 269,808

[22] Filed: Jun. 30, 1994

[30] Foreign Application Priority Data

Jun. 30, 1993 [FR] France .................. 93 08004

[51] Int. Cl.$^6$ .................. H03K 17/10; H03K 19/0185
[52] U.S. Cl. .................. 327/333; 327/391; 326/62; 326/68
[58] Field of Search .................. 327/333, 215, 327/219, 225, 437, 374, 389, 391; 326/62, 68, 63, 75, 80, 81; 323/315

[56] References Cited

U.S. PATENT DOCUMENTS

| 4,532,436 | 7/1985 | Bismarck | 326/62 |
| 5,045,721 | 9/1991 | Yan | 326/62 |
| 5,113,097 | 5/1992 | Lee | 327/333 |
| 5,153,451 | 10/1992 | Yamamura et al. | 327/333 |
| 5,191,233 | 3/1993 | Nakano | 307/272.3 |
| 5,321,324 | 6/1994 | Harder et al. | 326/62 |
| 5,378,932 | 1/1995 | Shin et al. | 327/333 |

FOREIGN PATENT DOCUMENTS 0342581  11/1989  European Pat. Off. .

Primary Examiner—Timothy P. Callahan
Assistant Examiner—Eunja Shin
Attorney, Agent, or Firm—Bernard Franzblau

[57] ABSTRACT

An interface circuit makes it possible, starting from an input signal varying between a reference level (VR) available on a first terminal and a first voltage level (V1), to deliver an output signal varying between this reference level (VR) and a second voltage level (V2) available on a second terminal. The circuit includes first and second branches each including first and second serially connected complementary transistors and a third branch with serially connected first and second transistors. First and second inverters couple the input terminal to respective control electrodes of the second transistors in the second and third branches. The inverters have response times chosen so that the two transistors of the third branch are never on simultaneously. Thus, short-circuiting the transistors of the second branch during the transient regime creates almost no current spike. It is therefore possible to use transistors with large dimensions in the third branch with respect to the other transistors of the circuit without impairing the efficiency thereof. The interface circuit can be used in a voltage level-shift circuit.

11 Claims, 2 Drawing Sheets

5,465,069

INTERFACE CIRCUIT AND VOLTAGE-RAISING CIRCUIT INCLUDING SUCH A CIRCUIT

FIELD OF THE INVENTION

The subject of the present invention is an interface circuit which makes it possible, starting from a signal applied to its input varying between a reference level available on a first terminal and a first voltage level, to deliver an output signal varying between this reference level and a second voltage level such that the excursion of the output signal is greater than or equal to that of the input signal, this second voltage level being available on a second terminal. The interface circuit includes:

- a first and a second branch each comprising a first and a second mutually complementary transistors, which have a first and a second main electrodes and a control electrode, and whose first main electrode/second main electrode and second main electrode/first main electrode paths are placed in series between the said terminals, the control electrodes of the first transistors of the first and of the second branches being connected respectively to the second main electrodes of the first transistors of the second and of the first branch,
- and a first inverter module whose input is linked to the input of the interface circuit as well as to the control electrode of the second transistor of the first branch, and whose output is linked to the control electrode of the second transistor of the second branch.

Such interface circuits are used especially in voltage-raising circuits allowing the interfacing of circuits with low supply voltage and circuits with higher supply voltage. Such is, for example, the case in portable microchip card reader interfacing circuits which are subjected to low supply voltages (2.5 V) whereas the microchip cards require supply voltages of 5 V.

BACKGROUND OF THE INVENTION

An interface circuit for charging a capacitor used in a voltage-raising circuit is described in European Patent Application n°0 342 581. In the transient regime, when the input signal of the interface circuit changes from the high level to the low level for example, the first and the second transistors of this second branch are both on for a short instant. This brief short-circuit creates a current spike which is higher as the dimensions of the two transistors is made larger.

SUMMARY OF THE INVENTION

In the case of high-current applications, and especially for microchip card reader interfacing circuits having to withstand current surges of the order of 20 mA, these transistors have to be of large dimension, which therefore entails an appreciable drop in the total efficiency of the voltage raiser.

The purpose of the invention is to propose a high-current interface circuit, of small size, which remedies this drawback.

To do this, an interface circuit according to the invention and such as that described in the introductory paragraph is characterized in that it includes:

- a third branch comprising a first and a second mutually complementary transistor which are of large dimension with respect to those of the second branch, and whose first main electrode/second main electrode and second main electrode/first main electrode paths are placed in series between the said terminals, the second main electrode of the first transistor of this third branch constituting an output of the interface circuit, and its control electrode being linked to that of the first transistor of the second branch,
- and a second inverter module whose input is linked to the input of the interface circuit and whose output is linked to the control electrode of the second transistor of this third branch, the response times of the first and second inverter modules being chosen such that the first and second transistors of the third branch are never on at the same instant.

Since the first and second transistors of the third branch of the interface circuit are never on at the same instant, it is possible to give them large dimensions without appreciably lowering the efficiency of the circuit. Since it is then possible to give the first and second transistors of the second branch smaller dimensions, short-circuiting them creates only small current spikes.

The invention also relates to a voltage-raising circuit including an interface circuit such as described in the preceding paragraphs, and in particular, a voltage-raising circuit which includes an interface circuit for controlling the control electrode of a transistor, of the same polarity as the said first transistors, constituting a breaker switch, the first and second main electrodes of this transistor being linked respectively on the one hand to a third terminal delivering a signal varying between the first and second voltage levels, and on the other hand to the second terminal.

BRIEF DESCRIPTION OF THE DRAWINGS

Other features, details and advantages of the invention will become clear through the description which follows in connection with the attached drawings which relate to examples given without limitation, in which.

DESCRIPTION OF THE PREFERRED EMBODIMENT

Figure 1:
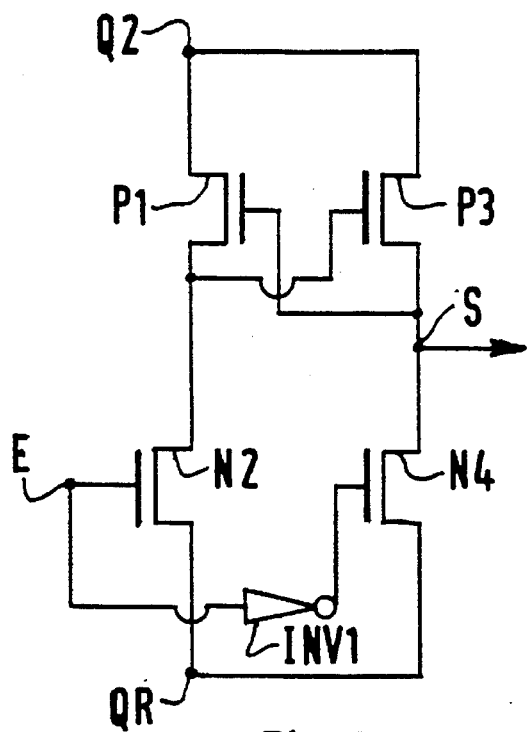
FIG. 1 is a diagram of an interface circuit according to the prior art.

In the description which follows, the first transistors are P-channel MOSFETs and the second transistors are N-channel MOSFETs. The terms first and second main electrodes and control electrode therefore designate the source, drain and gate respectively of these transistors. In the attached figures the P-channel transistors are designated with the letter P followed by the reference numeral of the transistor. Similarly, the N-channel transistors are designated with the letter N followed by the reference numeral of the transistor.

However, and although this embodiment is not described, an interface circuit according to the invention can be produced with first N-channel transistors and second P-channel transistors.

In accordance with FIG. 1, an interface circuit according to the prior art comprises two branches each including a P-channel MOS transistor, P1 and P3, and an N-channel MOS transistor, N2 and N4. The sources of the transistors P1 and P3 are connected to a terminal Q2 delivering a voltage V2, and their drains are connected to the drains of the transistors N2 and N4 respectively. The sources of the transistors N2 and N4 are connected to a terminal QR delivering a reference voltage VR, and their gates are coupled to a terminal E delivering an input signal, directly for transistor N2, and via an inverter module INV1 for transistor N4. The gate of the transistor P3 is connected to the drain of the transistor P1, and the gate of the transistor P1 is connected to the drain of the transistor P3, thus constituting an output S of the interface circuit.

During the first steady state (when the level of the input signal is equal to V1, for example), the transistor N4 is blocked and the transistor N2 conducts, thus imposing a voltage level close to VR on the gate of the transistor P3 which, consequently, also conducts. The level of the output signal at S is therefore almost equal to V2 and the transistor P1 is blocked. During the transient state which results from the changing of the input signal from the voltage level V1 to the reference level VR, the transistors P3 and N4 both conduct. This brief short-circuit creates a current spike I drawn at the output S of the circuit:

$$I = V2/(R_{dsP3} + R_{dsN4})$$

where $R_{dsP3}$ and $R_{dsN4}$ are the values of the drain/source resistances of the transistors P3 and N4 while conducting. They are equal to:

$$R_{ds} = [L/(W \cdot \mu \cdot C_0)] \cdot [V_{gs} - V_s]^{-1}$$

where L is the length of the channel, W its width, $\mu$ the mobility of the carriers, $C_o$ the gate/substrate capacitance of the transistor per unit surface area $V_{gs}$ its gate/source voltage, and $V_s$ its threshold voltage.

This current spike is therefore all the greater the smaller the values of these resistances, that is to say the larger are the dimensions of the transistors P3 and N4.

For certain high-current applications the transistors P3 and N4 have to be given large dimensions. The use of such an interface circuit then leads to an impairment of the overall efficiency.

Figure 2:
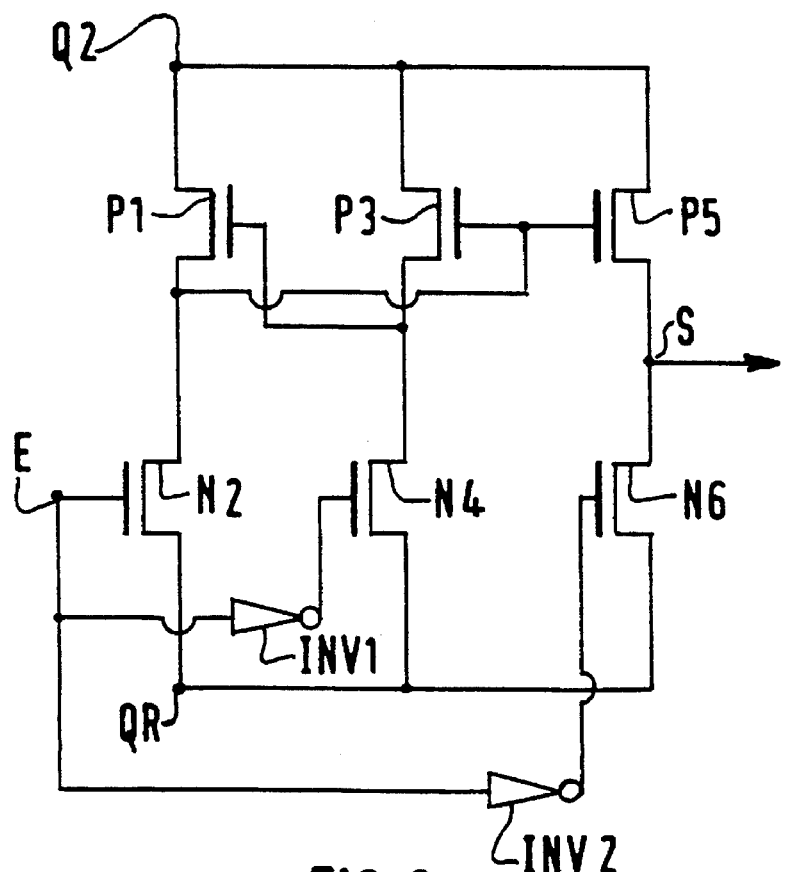
FIG. 2 is a diagram of an example of an interface circuit according to the invention.

FIG. 2 is an example of an interface circuit according to the invention which, while remaining of small in size, makes it possible to improve the efficiency obtained for high-current applications.

In accordance with FIG. 2, an interface circuit according to the invention includes, in addition to the elements described in FIG. 1, a third branch comprising a P-channel MOS transistor, P5, and an N-channel MOS transistor N6. The source of the transistor P5 is connected to the terminal Q2, its gate is linked to that of the transistor P3 and its drain is connected to that of the transistor N6. The source of the transistor N6 is linked to the terminal QR, and its gate is connected via an inverter module INV2 to the input terminal E. The output of this circuit henceforth consists of the drains of the transistors P5 and N6.

The inverter modules INV1 and INV2 are constructed in such a way that the transistors P5 and N6 are never on at the same instant. Thus, their large dimensions have no influence on the overall efficiency since no current spike occurs in the third branch of the circuit.

Upon lowering the input signal from the voltage level V1 to the reference level VR, the transistors N2 and P5 change from the on state to the blocked state whereas the transistors N4 and N6 change from the blocked state to the on state. In order for the transistors P5 and N6 not to be on at the same time, the transistor N6 must change to the on state only when the transistor P5 is no longer conductive. That is to say, the inverter module INV1 must be faster than the inverter module INV2 for a lowering of the input signal. Conversely, for a rise in the input signal from the reference level VR to the voltage level V1, the transistor P5 must change to the on state only when the transistor N6 is no longer on. That is to say the inverter module INV2 must be faster than the inverter module INV1 for a rise in the input signal.

Figure 3:
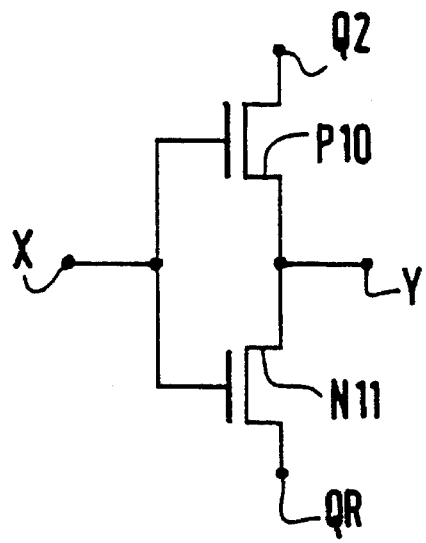
FIG. 3 is a diagram of an inverter module produced with CMOS technology.

To do this, in accordance with FIG. 3, each inverter module is made with CMOS technology by means of two mutually complementary transistors P10 and N11, the drains of which are joined together to constitute the Y output of the inverter module, the gates of which are linked to the input X of the inverter module, the source of the transistor P10 being linked to the terminal Q2 and that of the transistor N11 to the terminal QR. In addition, each transistor is dimensioned so as to obtain the response times indicated in the previous paragraph.

Figure 4:
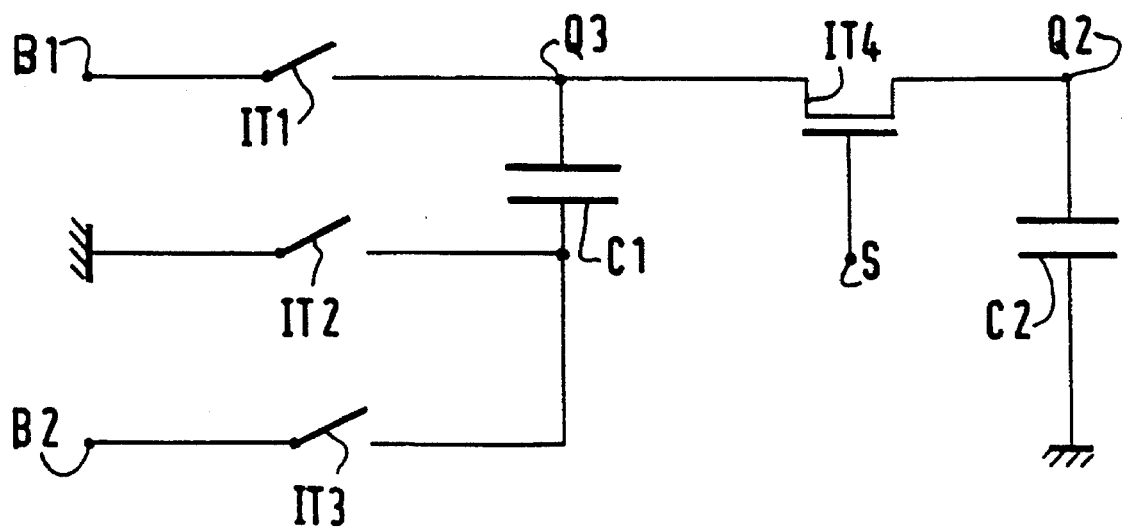
FIG. 4 is a basic diagram of an example of a voltage-raising circuit including an interface circuit according to the invention.

FIG. 4 is a basic diagram of an example of a voltage-raising circuit including an interface circuit according to the invention. This circuit includes four breaker switches IT1, IT2, IT3 and IT4 as well as two capacitors C1 and C2. The first terminal of the capacitor C1 is connected on the one hand to a node B2 via the breaker switch IT3, and on the other hand to ground via the breaker switch IT2. Its second terminal Q3 is connected on the one hand to a node B1 via the breaker switch IT1, and on the other hand to the terminal Q2 via the breaker switch IT4 produced with the aid of a P-channel MOS transistor. The gate of the transistor IT4 is connected to the output S of an interface circuit such as that represented in FIG. 2, and the terminal QR of which is connected to ground. Lastly, the terminal Q2 is connected to ground via the capacitor C2.

This voltage-raising circuit makes it possible for example, starting from a voltage V1 available on the nodes B1 and B2, to obtain a voltage V2 equal to 2×V1 on the terminal Q2. To do this, firstly, the capacitor C1 is charged to the voltage V1 by closing the breaker switches IT1 and IT2. Then, secondly, it is the breaker switches IT3 and IT4 which are closed so as to reference the capacitor C1 to the voltage V1 in order to charge the capacitor C2 to the voltage 2×V1. When the voltage V2=2×V1 is available on the terminal Q3, the transistor IT4 has to be on so as to charge the capacitor C2. Its gate has therefore to receive a signal of low level with respect to V2. This signal is supplied to it by the interface circuit of FIG. 2 to whose input a voltage signal VR is applied. Conversely, in order to close the breaker switch IT4, a voltage signal V2 is applied to the gate of the transistor IT4, this signal being supplied to it by the interface circuit to which a signal of level V1 is applied.

In the case of microchip card reader interfacing circuits for example, the capacitor C2 has to withstand high-current discharges. The breaker switch IT4 is therefore given large dimensions and its gate/substrate capacitance is sizeable. This entails also giving the two transistors P5 and N6 of the third branch large dimensions.

In a practical example of the implementation of such a voltage-raising circuit for a microchip card reader interfacing circuit, for a frequency of the input signal equal to 2 MHz, the channel width/channel length ratios (W/L) used are as follows:

transistor P1 : W/L = 100/2
transistor N2 : W/L = 100/2

```
                -continued
transistor P3 : W/L = 30/2
transistor N4 : W/L = 20/2
transistor P5 : W/L = 1500/2
transistor N6 : W/L = 1000/2
transistor IT4 : W/L = 10,000/2
inverter INV1    → transistor P10 : W/L = 30/2
                 → transistor N11 : W/L = 6/2
inverter INV2    → transistor P10 : W/L = 30/2
                 → transistor N11 : W/L = 50/2
```

Under these conditions, the interface circuit such as represented in FIG. 2 consumes only a few hundreds of microamperes in the transient regime, whereas the interface circuit according to the prior art consumed several hundreds of milliamperes. It is thus possible to increase the efficiency of a voltage-raising circuit described in FIG. 4 from 75% to 85%.

It goes without saying that variants may be proffered to the embodiments just described, especially by substituting equivalent technical means, without however thereby departing from the scope of the present invention.

We claim:

1. An interface circuit which is responsive to a signal applied to its input that varies between a reference level (VR) available on a first terminal and a first voltage level (Vl) to deliver an output signal varying between reference level (VR) and a second voltage level (V2) such that the excursion of the output signal is greater than or equal to that of the input signal, the second voltage level (V2) being available on a second terminal, said interface circuit comprising:

a first branch comprising a first and a second mutually complementary transistor, which each have a first and a second main electrode and a control electrode, the first main electrode/second main electrode and second main electrode/first main electrode paths being connected in series between the first and second terminals, a second branch comprising a third and a fourth mutually complementary transistor which each have a first and a second main electrode and a control electrode, the first main electrode/second main electrode and second main electrode/first main electrode paths being connected in series between the first and second terminals, the control electrodes of the first and third transistors of the first and of the second branches being connected respectively to the second main electrodes of the third and first transistors of the second and of the first branch, a first inverter module having an input coupled to the input of the interface circuit and to the control electrode of the second transistor of the first branch and an output coupled to the control electrode of the fourth transistor of the second branch, a third branch comprising a fifth and a sixth mutually complementary transistor which are of large dimension with respect to the transistors of the second branch and whose first main electrode/second main electrode and second main electrode/first main electrode paths are coupled in series between said first and second terminals, the second main electrode of the fifth transistor of the third branch constituting an output of the interface circuit, and its control electrode being coupled to that of the third transistor in the second branch, and a second inverter module having an input coupled to the input of the interface circuit and an output coupled to the control electrode of the sixth transistor of the third branch, the response times of the first and second inverter modules being chosen such that the fifth and sixth transistors of the third branch are never on at the same instant.

2. The interface circuit according to claim 1, wherein its transistors comprise MOS field-effect transistors.

3. The interface circuit according to claim 1 wherein each inverter module includes two mutually complementary transistors which are dimensioned such that the response of the first inverter module is faster than that of the second inverter module when the signal at the input of the interface circuit changes from the first voltage level (V1) to the reference level (VR), and is slower when said signal changes from the reference level (VR) to the first voltage level (V1).

4. A voltage-raising circuit comprising an interface circuit according to claim 1 for controlling a control electrode of a further transistor of the same polarity as said first transistor and constituting a breaker switch, first and second main electrodes of said further transistor being coupled respectively to a third terminal delivering a signal varying between the first and second voltage levels (Vl, V2) and to the second terminal of the interface circuit.

5. A voltage-raising circuit according to claim 4 further comprising:

a first switching device coupling said third terminal to a circuit point at said first voltage level (V1), a first capacitor having a first terminal connected to said third terminal and having a second terminal coupled to a point of reference voltage and to said circuit point at said first voltage level via second and third switching devices, respectively, and a second capacitor coupled to said second terminal of the interface circuit and to said point of reference voltage.

6. An interface voltage level shift circuit comprising:

first and second voltage terminals, a first branch circuit comprising first and second complementary transistors connected in a first series circuit between said first and second voltage terminals, a second branch circuit comprising third and fourth complementary transistors connected in a second series circuit between said first and second voltage terminals, a third branch circuit comprising fifth and sixth complementary transistors connected in a third series circuit between said first and second voltage terminals, first and second inverter devices, a signal input terminal, first means coupling said signal input terminal directly to a control electrode of the second transistor, to a control electrode of the fourth transistor via said first inverter device, and to a control electrode of the sixth transistor via said second inverter device, said first and second inverter devices being chosen so that the fifth and sixth transistors are never conducting simultaneously, second means coupling a control electrode of the fifth transistor to a control electrode of the third transistor and to a first junction point between the first and second transistors, third means coupling a control electrode of the first transistor to a second junction point between the third and fourth transistors, and an output terminal coupled to a third junction point between the fifth and sixth transistors.

7. The interface voltage level shift circuit as claimed in claim 6 wherein said first, third and fifth transistors comprise P-type MOS field effect transistors and said second, fourth and sixth transistors comprise N-type MOS field effect transistors.

8. The interface voltage level shift circuit as claimed in claim 6 wherein at least one of said inverter devices comprises:

seventh and eighth complementary transistors connected in a further series circuit between said first and second voltage terminals, wherein a common junction point between said seventh and eighth transistors comprise an output of the inverter device, and means coupling control electrodes of the seventh and eighth transistors in common to an input of the inverter device.

9. The interface voltage level shift circuit as claimed in claim 8 wherein each of said inverter devices are as claimed in claim 8 and said seventh and eighth transistors of each inverter device are dimensioned so that the first inverter device has a faster response than the second inverter device when the input signal at the signal input terminal changes from a first voltage level (V1) to a reference voltage level (VR) and has a slower response when said input signal changes from the reference voltage level to the first voltage level.

10. The interface voltage level shift circuit as claimed in claim 6 wherein the dimensions of the fifth and sixth transistors are much larger than are the dimensions of the third and fourth transistors.

11. The interface voltage level shift circuit as claimed in claim 10 wherein transitions of the input signal produce a short-circuit via said third and fourth transistors being on simultaneously for a short period of time.

* * * * *